(12) United States Patent
Teene

(10) Patent No.: US 7,299,431 B2
(45) Date of Patent: Nov. 20, 2007

(54) METHOD FOR TRACING PATHS WITHIN A CIRCUIT

(75) Inventor: Andres Teene, Fort Collins, CO (US)

(73) Assignee: LSI Corporation, Milpitas, CA (US)

( * ) Notice: Subject to any disclaimer, the term of this patent is extended or adjusted under 35 U.S.C. 154(b) by 334 days.

(21) Appl. No.: 11/074,173

(22) Filed: Mar. 7, 2005

(65) Prior Publication Data

US 2006/0200787 A1 Sep. 7, 2006

(51) Int. Cl.
*G06F 17/50* (2006.01)
(52) U.S. Cl. ................... 716/4; 716/7; 703/14
(58) Field of Classification Search .......... 716/4, 716/7; 703/14
See application file for complete search history.

(56) References Cited

U.S. PATENT DOCUMENTS

| | | | | | |
|---|---|---|---|---|---|
| 5,703,798 | A | * | 12/1997 | Dhar | 703/14 |
| 5,883,811 | A | * | 3/1999 | Lam | 716/6 |
| 5,946,475 | A | * | 8/1999 | Burks et al. | 716/6 |
| 6,185,723 | B1 | * | 2/2001 | Burks et al. | 716/6 |
| 6,405,348 | B1 | * | 6/2002 | Fallah-Tehrani et al. | 716/4 |
| 6,601,220 | B1 | * | 7/2003 | Allen et al. | 716/4 |
| 6,662,149 | B1 | * | 12/2003 | Devgan et al. | 703/14 |
| 6,711,534 | B1 | * | 3/2004 | Parashkevov | 703/15 |
| 6,711,722 | B1 | * | 3/2004 | Parashkevov et al. | 716/3 |
| 7,103,522 | B1 | * | 9/2006 | Shepard | 703/14 |
| 7,117,461 | B1 | * | 10/2006 | Srinivasan et al. | 716/4 |
| 2003/0037306 | A1 | * | 2/2003 | Gutwin et al. | 716/6 |
| 2004/0003356 | A1 | * | 1/2004 | Dewey et al. | 716/4 |
| 2004/0177332 | A1 | * | 9/2004 | Pandey et al. | 716/5 |
| 2004/0230921 | A1 | * | 11/2004 | Hathaway et al. | 716/2 |

OTHER PUBLICATIONS

Adler, "Switch-level simulation using dynamic graph algorithms", IEEE Transactions on Computer-Aided Design of Integrated Circuits and Systems, vol. 10, No. 3, Mar. 1991, pp. 346-355.*
Fusco, "Symbolic transfer functions for MESFET small-signal parameter extraction", IEE Proceedings of Circuits, Devices and Systems, vol. 138, No. 2 Apr. 1991, pp. 217-221.*
Dey et al., "Circuit partitioning and resynthesis", Proceedings of the IEEE 1990 Custom Integrated Circuits Conference, May 13-16, 1990, pp. 29.4/1-29.4/5.*
Hu et al., "Folding an array of transistors and contacts", Proceedings of 1992 IEEE International Symposium on Circuits and Systems, vol. 6, May 10-13, 1992, pp. 2969-2972.*
Shelar et al., "Recursive bipartitioning of BDDs for performance driven synthesis of pass transistor logic circuits", IEEE/ACM International Conference on Computer Aided Design, 2001, pp. 449-452.*

(Continued)

*Primary Examiner*—Phallaka Kik
(74) *Attorney, Agent, or Firm*—Strategic Patent Group, Inc.

(57) ABSTRACT

A method for tracing paths within a circuit includes receiving a transistor level netlist description. After receiving the transistor level netlist, convert the transistor level netlist to a transistor level data structure. Then, convert the transistor level data structure to a set of channel connect groups (CCG). A directed graph of the CCG may be generated.

21 Claims, 2 Drawing Sheets

OTHER PUBLICATIONS

Klumperink et al., "Finding all elementary circuits exploiting transconductanc", IEEE Transactions on see also Circuits and Systems II: Analog and Digital Signal Processing, Express Briefs, vol. 48, No. 11, Nov. 2001, pp. 1039-1053.*

Shelar et al., "An efficient algorithm for low power pass transistor logic synthesis", Proceedings of 7th Asia and South Pacific and the 15th International Conference on VLSI Design, 2002, pp. 87-92.*
Chang et al., "Consistency Checking for MOS/VLSI Circuits", 20th Conference on Design Automation, Jun. 27-29, 1983, pp. 732-733.*

* cited by examiner

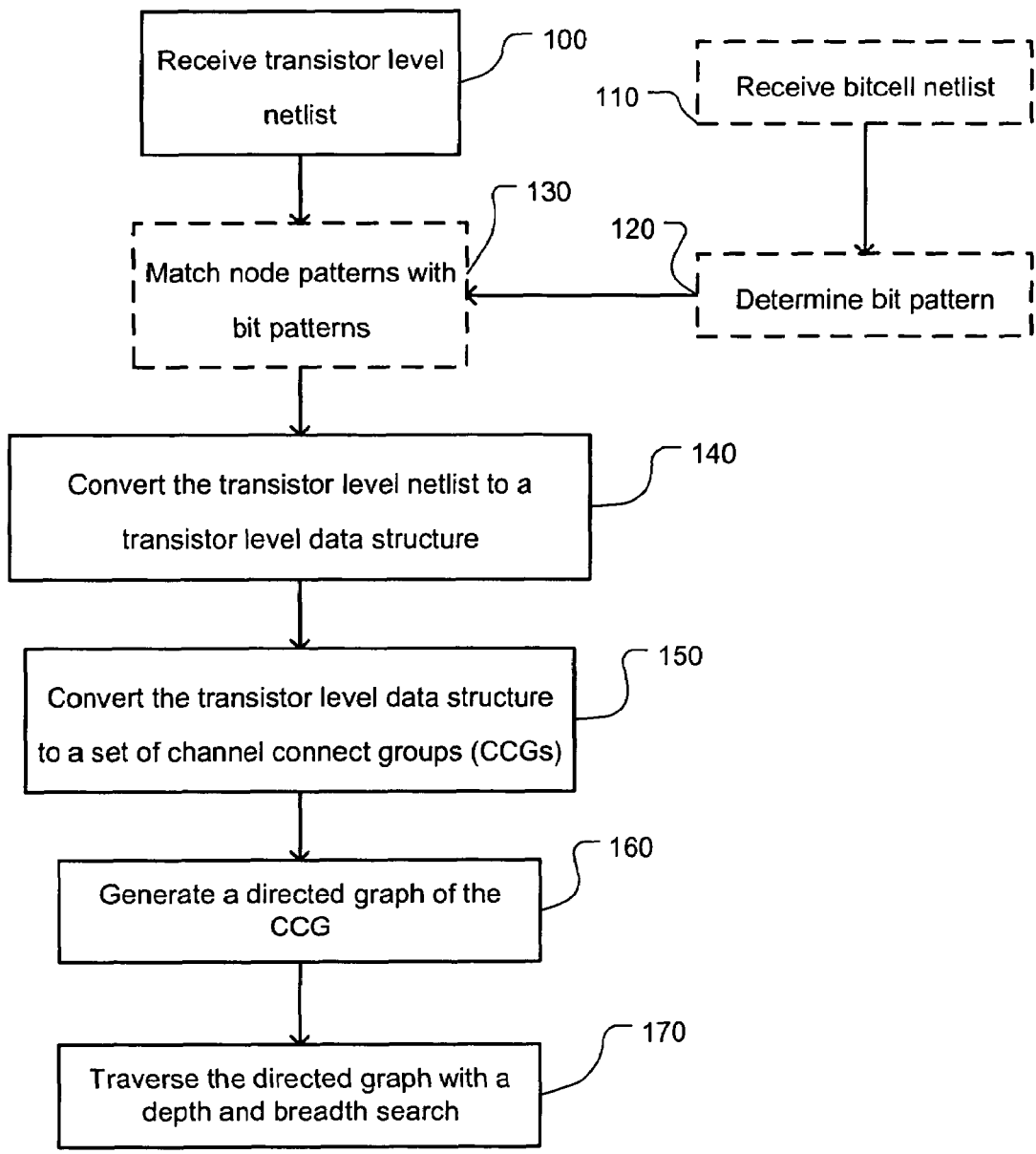
FIG._1

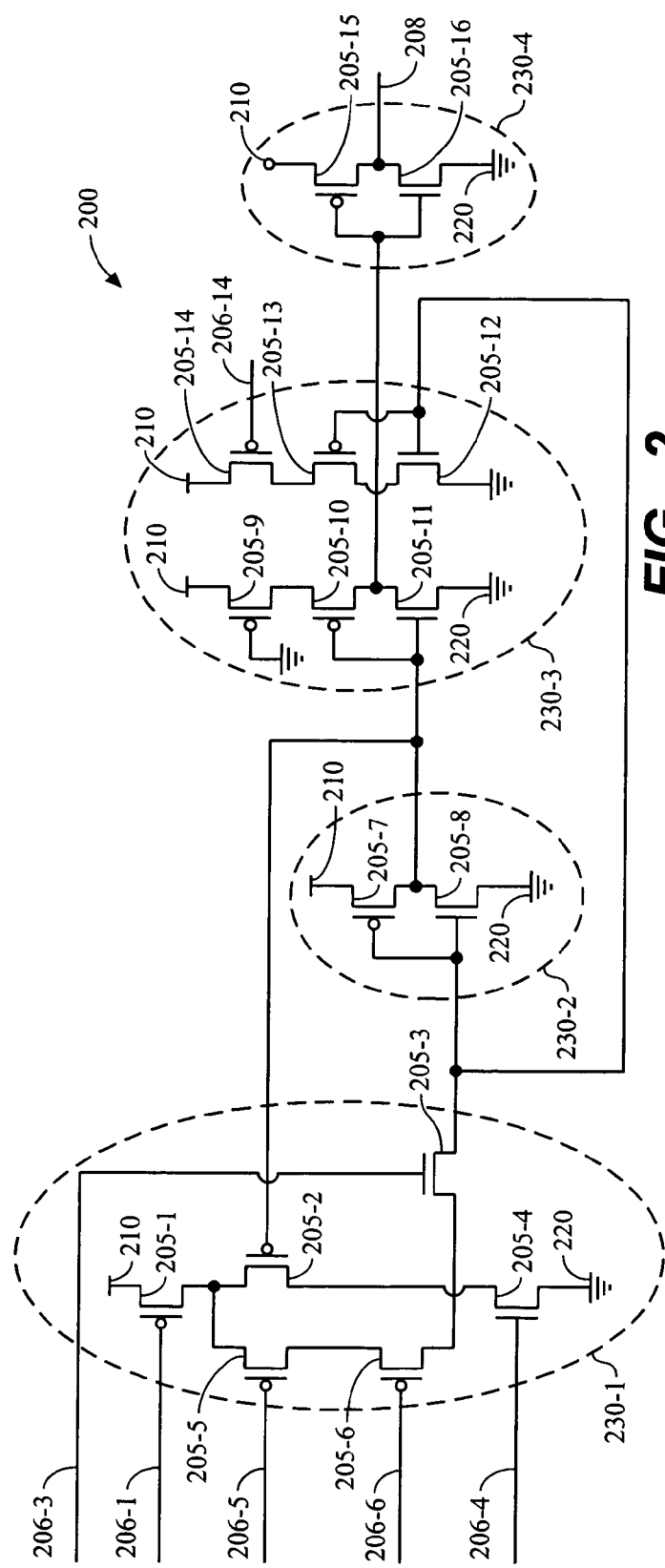
FIG._2
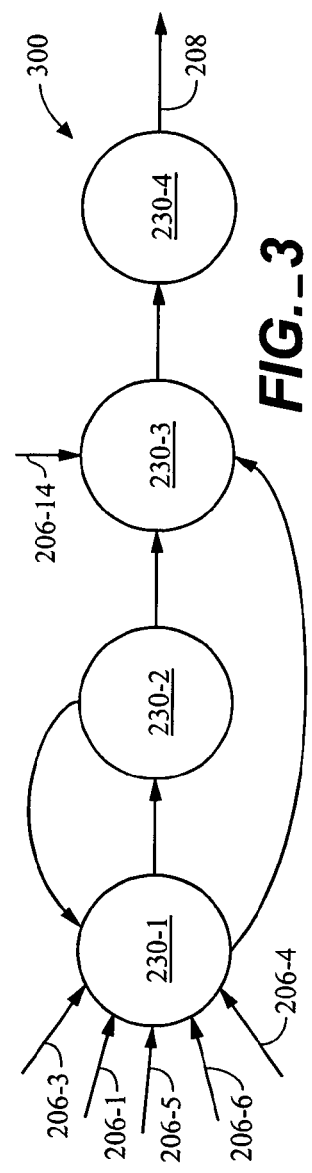
FIG._3

METHOD FOR TRACING PATHS WITHIN A CIRCUIT

FIELD OF THE INVENTION

The present invention relates to circuit analysis, and more particularly to tracing paths within a circuit.

BACKGROUND OF THE INVENTION

During the design of circuits, many different devices are connected together in multiple ways. Internal paths critical to the operation of circuits such as memory should be analyzed for design and timing margins. Without such analysis, robust designs are more difficult to achieve.

In particular, the issue arises for analysis and verification of third party circuits where the detailed design information such as schematics are not available. Current methods for analysis of circuits may rely on transistor level simulation of the circuit, however this may be complicated and time consuming.

Accordingly, what is needed is more efficient and less time-consuming method for tracing paths within a circuit. The present invention addresses such a need.

BRIEF SUMMARY OF THE INVENTION

Aspects of the present invention include a method for tracing paths within a circuit. First, a transistor level netlist is received. After receiving the transistor level netlist, the transistor level netlist description is converted to a transistor level data structure. Then, the transistor level data structure is converted to a set of channel connect groups (CCG). A directed graph of the CCG may then be generated.

According to the method disclosed herein, the present invention uses CCGs to represent transistor groups and provides a graph-based analysis of traversal functions, which improves the speed of path tracing and finding critical paths in a circuit. The present invention eliminates the need for simulation in order to analyze complex transistor circuits.

BRIEF DESCRIPTION OF SEVERAL VIEWS OF THE DRAWINGS

FIG. 1 is a flow diagram illustrating one embodiment of the invention for tracing paths within a circuit.

FIG. 2 is a diagram illustrating one example of a transistor level representation.

FIG. 3 is a diagram illustrating one example of a directed graph of channel connect groups.

DETAILED DESCRIPTION OF THE INVENTION

The present invention relates to circuit analysis, and more particularly to tracing paths within a circuit. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

FIG. 1 is a flow diagram illustrating one embodiment of the invention for tracing paths within a circuit. The method of FIG. 1 may be applied to any circuit, for example a memory, other integrated circuit (IC), or a third-party circuit. In block 100, a user receives a transistor level netlist of a circuit (not shown). Transistor level netlists are well-known in the art.

Optionally, the user may also receive a bitcell netlist for the circuit, which is also well known in the art, in block 110. The bitcell netlist (not shown) provides information about the bit cells within the circuit. With the bitcell netlist, a bitcell pattern may be determined in block 120 by, for example, finding all the bit nodes in the circuit. In block 130 node patterns may be matched with bit patterns by, for example, finding corresponding bit line and word line connections for each bit cell node group in the circuit block. Bitcell, wordline, and bitline data from the corecell netlist may be used hierarchically or propagated to the next level if the design representation is flattened by mapping appropriate node names. This data may be organized in different ways if used optionally with the invention.

Continuing with the invention, in block 140 the transistor level netlist is converted to a transistor level data structure (not shown). A transistor level data structure is typically used by a computer program in order to process the information in the transistor level netlist. The transistor level data can be represented as link-list or associative array data structures.

FIG. 2 is a schematic diagram illustrating one example of a transistor level representation 200. The transistor level representation 200 is one graphical representation of a transistor level netlist. Transistors 205-1, 205-2, 205-3, 205-4, 205-5, 205-6, 205-7, 205-8, 205-9, 205-10, 205-11, 205-12, 205-13, 205-14, 205-15, and 205-16 (collectively referred to as transistors 205) in the transistor level representation 200 are connected to one another, to power 210, and to ground 220. Each transistor 205 functionally has a gate, a source and a drain.

The transistor level representation 200 is illustrated in order to simplify the explanation of conversion to channel connect groups. In block 150 of FIG. 1, the transistor level data structure is converted to a set of channel connect groups (CCGs) 230-1, 230-2, 230-3, 230-4 (collectively referred to as CCGs 230) in one embodiment of the invention. Each CCG 230 includes transistors 205 having a source or a drain connected to the source or drain of another transistor 205 in that CCG 230, and all of the transistors 205 in the CCG have a gate that is connected external to the CCG. In other words, no transistor 205 within a given CCG 230 is connected to another transistor 205 in that CCG 230 through its gate.

For example, CCG 230-1 includes transistors 205-1, 205-2, 205-3, 205-4, 205-5 and 205-6. Transistor 205-1 has a gate connected to input 206-1 and a drain connected to power 210, and a source connected to transistors 205-2 and 205-5. One skilled in the art will recognize that different types of transistors may be used (for example, p or n-channel) and that in this example all the transistors may be n-channel, whereas p-channel transistors have reversed source and drain nodes, among other differences. Because transistors 205-1, 205-2 and 205-5 have drain/source connections (and they are not connected together through any of their gates) they are included in the same CCG 230-1. The gate of a transistor is considered an input to the CCG unless it is connected to a power source or to ground.

Moving on from transistor 205-2, transistors 205-7 and 205-8 are connected to the gate of transistor 205-2, so transistor 205-2 is in a separate CCG 230 from transistors 205-7 and 205-8. However, transistor 205-4 is connected to the drain of transistor 205-2 and to ground 220, so transistors 205-4 and 205-2 are both in CCG 230-1. Input 206-4 is connected to the gate of transistor 205-4 and therefore considered an input to CCG 230-1

Continuing from transistor 205-5, the source of transistor 205-6 is connected to the drain of transistor 205-5, therefore transistor 205-6 is also in CCG 230-1. Transistor 205-5 has input 206-5 at its gate while transistor 205-6 also has input 206-6 at its gate. Therefore, inputs 206-5 and 206-6 are both considered inputs to CCG 230-1. Transistor 205-3 has its source connected to the drain of transistor 205-6, putting transistor 205-3 in CCG 230-1 as well. Input 206-3 to the gate of transistor 205-3 is considered an input to CCG 230-1. Transistors 205-7, 205-8 and 205-12 are connected through their gates to transistor 205-3, therefore transistors 205-7, 205-8 and 205-12 are excluded from CCG 230-1.

Moving on to CCG 230-2, transistor 205-7 is connected through its source to power 210, and through its drain to transistor 205-8, placing both transistors in the same group. Transistors 205-7 and 205-8 have a drain/source connection to the gates of transistors 205-10, 205-11 and 205-2, therefore transistors 205-10, 205-11 and 205-2 are in separate groups from transistors 205-7 and 205-8. Finally, transistors 205-7 and 205-8 are connected trough their gates to transistors 205-3 and 205-12, placing transistors 205-7 and 208 in a separate group. CCG 230-2 therefore includes transistors 205-7 and 205-8.

Moving on to CCG 230-3, transistors 205-12, 205-13 and 205-14 are connected to one another through their respective sources and drains, and to power 210 and ground 220, therefore they are in a group together. Likewise, transistors 205-9, 205-10 and 205-11 are connected to one another through their respective sources and drains, and to power 210 and ground 220 respectively, therefore they are in a group together. Transistors 205-10, 205-11, 205-12 and 205-13 share a source/drain connection, therefore all of transistors 205-9, 205-10, 205-11, 205-12, 205-13, and 205-14 are in CCG 230-3. Transistors 205-15 and 205-16 are not in CCG 230-3 because they connect through their gates to the source/drain connection of transistors 205-10, 205-11, 205-12 and 205-13.

Input 206-14 to transistor 205-14 is also considered an input to CCG 230-3. However, the gate of transistor 205-9 is tied to ground and therefore not considered an input to CCG 230-3.

Moving on to CCG 230-4, transistors 205-15 and 205-16 have a source/drain connection, therefore they are in the same CCG. Transistor 205-15 is connected to power 210 while transistor 205-16 is connected to ground. Transistors 205-15 and 205-16 are therefore included in CCG 230-4. CCG 230-4 has output 208 from the source-drain connection of transistors 205-15 and 205-16.

Having completed block 150 of FIG. 1 by converting a transistor level representation to CCGs 230, in block 160 a directed graph of CCGs 230 may be generated.

FIG. 3 is a diagram illustrating one embodiment of a directed graph 300 of CCGs 230. CCG 230-1 has inputs 206-3, 206-1, 206-5, 206-6, and 206-4, and two outputs. The five inputs to CCG 230-1 are from transistors 205-1, 205-2, 205-4, 205-5 and 205-6 that each have a gate connected to an input source from outside CCG 230-1. The input to transistor 205-3 is from transistors 205-7 and 205-8 (CCG 230-2). CCG 230-1 has two outputs from the drain of transistor 205-3 to the gates of transistors 205-7 and 205-8 (CCG 230-2) and to the gate of transistor 205-12 (CCG 230-3).

CCG 230-2 has one input and two outputs. The one input to CCG 230-2 is to each of transistors 205-7 and 205-8 and is from transistor 205-3 (CCG 230-1). CCG 230-2 has two outputs from the source/drain junction of transistors 205-7 and 205-8 to the gates of transistors 205-2 (CCG 230-1) and 205-11 (CCG 230-3).

CCG 230-3 has three inputs, including input 206-14, and one output. CCG 230-3 has one input to transistors 205-10 and 205-11 (from transistors 205-10 and 205-11 in CCG 230-2), one input to transistors 205-12 and 205-13 (from transistor 205-3 in CCG 230-1), and input 206-14. CCG 230-3 has one output from the source/drain junction of transistors 205-10, 205-11, 205-12 and 205-13 to the gates of transistors 205-15 and 205-16 (CCG 230-4).

CCG 230-4 has one input to transistors 205-15 and 205-16 from transistors 205-10, 205-11, 205-12 and 205-13 in CCG 230-3. CCG 230-4 has output 208.

Having completed block 160 of FIG. 1 by generating a directed graph 300 of the CCGs 230, in block 170 circuit paths through the directed graph 300 may be traversed with a depth and/or breadth search for the purpose of analysis, for example. One example of a traversal path of directed graph 300 begins with CCG 230-1, then to CCG 230-2, to CCG 230-3, and then to CCG 230-4, following each input to the next CCG 230. Another example of a traversal path of directed graph 300 also begins with CCG 230-1, then skips to CCG 230-3, and goes to CCG 230-4. Other examples of traversal paths may be possible, for example depth or breadth searches.

CCGs 230 also correspond to inverting transistor function groups, which can be used to determine the logic inversion state of paths, and logic structures.

One aspect of the invention is representing transistor groups with CCGs, as defined above. The CCGs reduce the complexity and improve the speed of analysis for path tracing and identifying critical paths. In contrast to conventional systems, the invention does not require simulation in order to analyze complex transistor level circuits. The invention may also be used for circuit characterization or determining design margins by identifying internal critical paths and nodes that need to be measured in the characterization process. The invention may also be applied to failure analysis and circuit debugging by identifying and tracing specific functional paths within the circuit.

Another feature of the invention is that logic states of transistor nodes may be used to enable or disable paths. For example, if the gate to transistor 205-3 is either tied to ground or has a zero logic state, then transistor 205-3 would be off and the path from CCG 230-1 to 230-2 would be disabled.

The logic states may also be propagated. For example, if gate inputs to both of transistors 205-4 and 205-5 are high (logic state one), then transistors 205-4 and 205-3 would be on. Therefore the drain of transistor 205-3 (the CCG 230-1 to 230-2 connection) would be logic state zero. This would propagate the logic state 'one' to the output of CCG 230-2. The use of logic state propagation can be used to reduce or eliminate false paths.

A method for tracing paths within a circuit has been disclosed. The present invention has been described in accordance with the embodiments shown, and one of ordinary skill in the art will readily recognize that there could be variations to the embodiments, and any variations would be within the spirit scope of the present invention. Accordingly, many modifications may be made by one of ordinary skill in the art without departing from the spirit and scope of the appended claims.

I claim:

1. A method for tracing paths within a circuit comprising:
receiving a transistor level netlist;
converting the transistor level netlist to a transistor level data structure;
converting the transistor level data structure to a set of channel connect groups (CCG), wherein each CCG comprises a plurality of transistors and wherein none of the transistors in a CCG is connected to a gate of another transistor in the same CCG; and
generating a directed graph of the CCG.

2. The method of claim 1, the transistor level data structure further comprising a plurality of transistors, each transistor having a gate, a source, and a drain connection.

3. The method of claim 1, each CCG further comprising a plurality of transistors, each of the transistors in a CCG having a source or a drain connected to the source or drain of another transistor in the CCG, and all of the transistors in the CCG having a gate that is connected external to the CCG.

4. The method of claim 1, each CCG further comprising an input node and an output node, wherein the output node of a first CCG is coupled to the input node of a second CCG.

5. The method of claim 4, the input node further comprising a gate of one of a plurality of transistors.

6. The method of claim 4, the output node further comprising a source or drain of one of a plurality of transistors.

7. The method of claim 6, the output node further comprising a source or drain of one of a plurality of transistors.

8. The method of claim 1 further comprising:
tracing paths through the circuit with the directed graph.

9. The method of claim 8, tracing paths further comprising:
traversing the directed graph with a depth first search.

10. The method of claim 8, tracing paths further comprising:
traversing the directed graph with a breadth first search.

11. A method for tracing paths within a circuit comprising:
receiving a transistor level netlist;
converting the transistor level netlist to a transistor level data structure;
converting the transistor level data structure to a set of channel connect groups (CCG), each CCG comprising a plurality of transistors, each of the transistors in a CCG having a source or a drain connected to the source or drain of another transistor in the CCG, and none of the transistors in the CCG is connected to a gate of another transistor in the CCG, each CCG further comprising an input node and an output node, the input node comprising the gate of one of the transistors in the CCG and the output further comprising the source or drain of one of the transistors in the CCG, wherein the output node of a first CCG is coupled to the input node of a second CCG;
generating a directed graph of the CCG; and
tracing paths through the circuit with the directed graph.

12. A computer-readable medium containing programming instructions causing the computer to implement a method for tracing paths within a circuit, the method comprising:
receiving a transistor level netlist;
converting the transistor level netlist to a transistor level data structure;
converting the transistor level data structure to a set of channel connect groups (CCG), wherein each CCG comprises a plurality of transistors and wherein none of the transistors in a CCG is connected to a gate of another transistor in the same CCG; and
generating a directed graph of the CCG.

13. The computer-readable medium of claim 12, the transistor level data structure further comprising a plurality of transistors, each transistor having a gate, a source, and a drain connection.

14. The computer-readable medium of claim 12, each CCG further comprising a plurality of transistors, each of the transistors in a CCG having a source or a drain connected to the source or drain of another transistor in the CCG, and all of the transistors in the COG having a gate that is connected external to the CCG.

15. The computer-readable medium of claim 12, each CCG further comprising an input node and an output node, wherein the output node of a first CCG is coupled to the input node of a second CCG.

16. The computer-readable medium of claim 15, the input node further comprising a gate of one of a plurality of transistors.

17. The computer-readable medium of claim 15, the output node further comprising a source or drain of one of a plurality of transistors.

18. The computer-readable medium of claim 17, the output node further comprising a source or drain of one of a plurality of transistors.

19. The computer-readable medium of claim 12, wherein the method further comprises:
tracing paths through the circuit with the directed graph.

20. The computer-readable medium of claim 19, said tracing paths further comprising:
traversing the directed graph with a depth first search.

21. The computer-readable medium of claim 19, said tracing paths further comprising:
traversing the directed graph with a breadth first search.

* * * * *